(12) United States Patent
Miyagawa

(10) Patent No.: US 9,761,415 B2
(45) Date of Patent: Sep. 12, 2017

(54) SEMICONDUCTOR MANUFACTURING APPARATUS AND SEMICONDUCTOR MANUFACTURING METHOD

(71) Applicant: Toshiba Memory Corporation, Minato-ku (JP)

(72) Inventor: Osamu Miyagawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 21 days.

(21) Appl. No.: 14/844,333

(22) Filed: Sep. 3, 2015

(65) Prior Publication Data

US 2016/0284521 A1    Sep. 29, 2016

(30) Foreign Application Priority Data

Mar. 27, 2015  (JP) ................................. 2015-066512

(51) Int. Cl.
*H01L 21/00* (2006.01)
*H01J 37/32* (2006.01)
*H01L 21/67* (2006.01)

(52) U.S. Cl.
CPC .. *H01J 37/32449* (2013.01); *H01J 37/32724* (2013.01); *H01J 37/32798* (2013.01); *H01L 21/67103* (2013.01); *H01L 21/67109* (2013.01); *H01L 21/67248* (2013.01)

(58) Field of Classification Search
CPC ......... H01L 21/67109; H01L 21/67248; H01L 21/00; H01J 37/32798

USPC ............................................................ 438/5
See application file for complete search history.

(56) References Cited

U.S. PATENT DOCUMENTS

| 8,596,336 B2 | 12/2013 | Fovell et al. |
| 2003/0007136 A1* | 1/2003 | Emoto ................ G03F 7/70525 355/30 |
| 2014/0311728 A1 | 10/2014 | Nonaka |

FOREIGN PATENT DOCUMENTS

| JP | WO 2010/032745 | * | 3/2010 | ............... H05H 1/46 |
| JP | 2010-73655 | | 4/2010 | |
| JP | 2013-26387 | | 2/2013 | |
| JP | 2013-243377 | | 12/2013 | |
| WO | WO 2010/032745 A1 | | 3/2010 | |

\* cited by examiner

*Primary Examiner* — Tuan Nguyen
(74) *Attorney, Agent, or Firm* — Oblon, McClelland, Maier & Neustadt, L.L.P.

(57) ABSTRACT

In one embodiment, a semiconductor manufacturing apparatus includes a housing configured to house a substrate, and a first temperature regulator configured to regulate a temperature of a fluid. The apparatus further includes first and second flow channels configured to divide the fluid supplied from the first temperature regulator, and a second temperature regulator configured to regulate a temperature of the fluid in the second channel. The apparatus further includes a fluid supply channel configured to join the fluid in the first flow channel and the fluid in the second flow channel and to supply the joined fluids to the housing, and a flow rate regulator configured to regulate a flow rate of the fluid in the first flow channel and a flow rate of the fluid in the second flow channel.

18 Claims, 2 Drawing Sheets

SEMICONDUCTOR MANUFACTURING APPARATUS AND SEMICONDUCTOR MANUFACTURING METHOD

CROSS REFERENCE TO RELATED APPLICATION

This application is based upon and claims the benefit of priority from the prior Japanese Patent Application No. 2015-66512, filed on Mar. 27, 2015, the entire contents of which are incorporated herein by reference.

FIELD

Embodiments described herein relate to a semiconductor manufacturing apparatus and a semiconductor manufacturing method.

BACKGROUND

A wafer in a process chamber of a plasma processing apparatus is often cooled by a refrigerant from plural chillers to regulate a wafer temperature quickly and accurately. However, if the number of chillers in the plasma processing apparatus increases, a wide installation region is needed for installing these chillers. Accordingly, there is a problem that the area for installing the plasma processing apparatus becomes larger. A similar problem may also occur in another semiconductor manufacturing apparatus that regulates the wafer temperature by a fluid supplied from a temperature regulator.

DETAILED DESCRIPTION

Embodiments will now be explained with reference to the accompanying drawings.

In one embodiment, a semiconductor manufacturing apparatus includes a housing configured to house a substrate, and a first temperature regulator configured to regulate a temperature of a fluid. The apparatus further includes first and second flow channels configured to divide the fluid supplied from the first temperature regulator, and a second temperature regulator configured to regulate a temperature of the fluid in the second channel. The apparatus further includes a fluid supply channel configured to join the fluid in the first flow channel and the fluid in the second flow channel and to supply the joined fluids to the housing, and a flow rate regulator configured to regulate a flow rate of the fluid in the first flow channel and a flow rate of the fluid in the second flow channel.

First Embodiment

Figure 1:
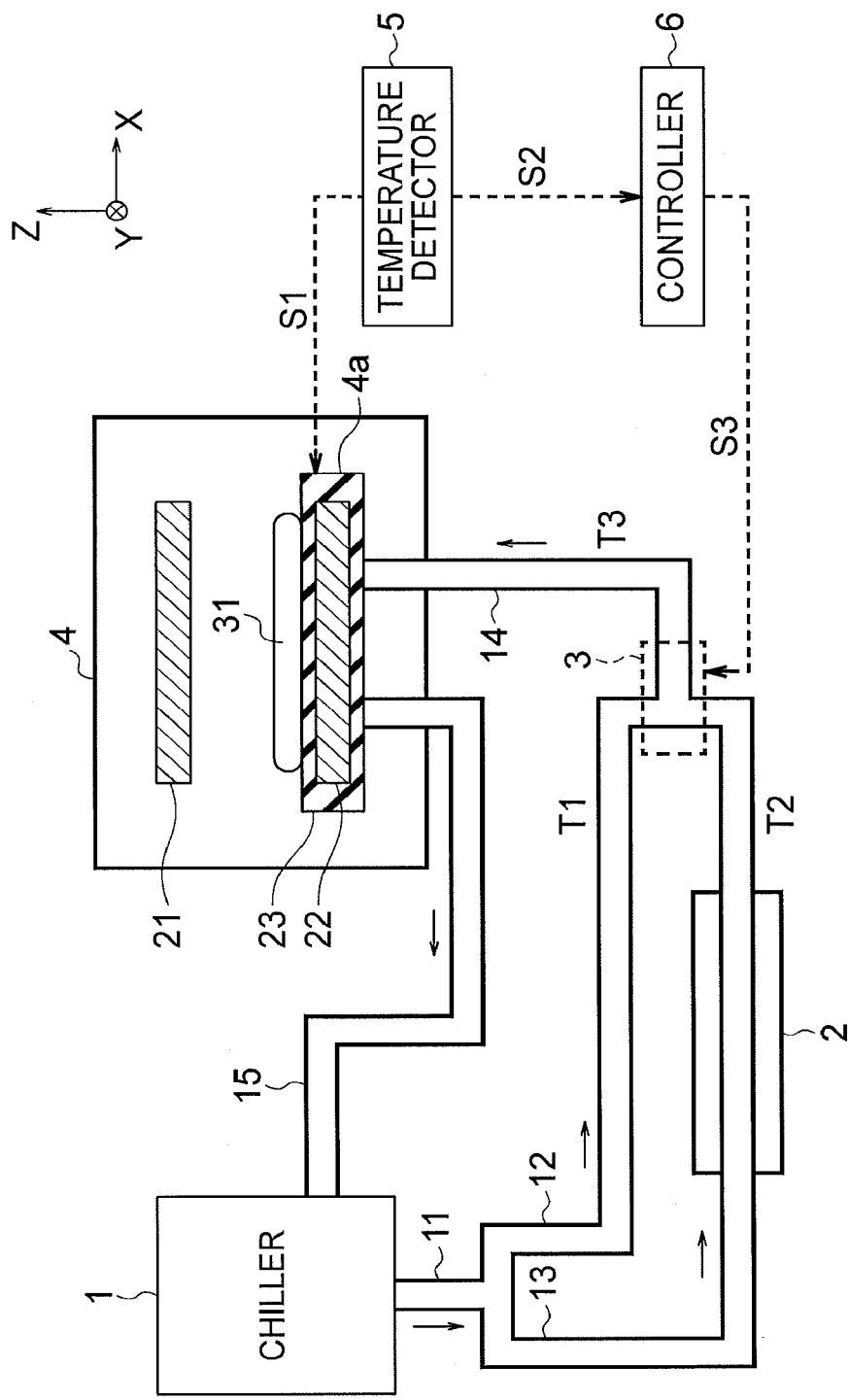
FIG. 1 is a schematic view illustrating a structure of a semiconductor manufacturing apparatus of a first embodiment.

FIG. 1 is a schematic view illustrating a structure of a semiconductor manufacturing apparatus of a first embodiment.

The semiconductor manufacturing apparatus illustrated in FIG. 1 includes a chiller 1, a heater 2, a valve box 3, a process chamber 4, a temperature detector 5 and a controller 6. The chiller 1 is an example of a first temperature regulator. The heater 2 is an example of a second temperature regulator. The valve box 3 and the controller 6 are an example of a flow rate regulator. The process chamber 4 is an example of a housing. The semiconductor manufacturing apparatus illustrated in FIG. 1 further includes a flow channel 11, a first flow channel 12, a second flow channel 13, a flow channel 14 and a flow channel 15. The flow channel 14 is an example of a fluid supply channel.

The semiconductor manufacturing apparatus illustrated in FIG. 1 is a plasma processing apparatus in which a wafer 31 in the process chamber 4 is processed by using plasma. The wafer 31 is an example of a substrate of the disclosure. The wafer 31 is mounted on an electrostatic chuck (ESC) 4a in the process chamber 4.

FIG. 1 illustrates X and Y directions parallel to a surface of the wafer 31 and perpendicular to each other, and a Z direction perpendicular to the surface of the wafer 31. In the specification, a +Z direction is assumed to be an upper direction, and a −Z direction is assumed to be a lower direction. For example, a positional relation between the ESC 4a and the wafer 31 is expressed as that the ESC 4a is arranged at a position lower than the wafer 31. The −Z direction of the present embodiment may or may not be the gravity direction.

The structure of the semiconductor manufacturing apparatus illustrated in FIG. 1 will be described in detail.

The chiller 1 regulates a temperature of coolant water (refrigerant), and specifically cools the coolant water. The coolant water is an example of a fluid of the disclosure. The chiller 1 regulates the temperature of the coolant water to a first temperature T1 as a setting temperature. The first temperature T1 of the present embodiment is 20° C. The coolant water cooled by the chiller 1 is discharged to the flow channel 11 from an outlet of the chiller 1.

The flow channel 11 is branched into the first and second flow channels 12 and 13. Therefore, the coolant water in the flow channel 11 flow separately to the first flow channel 12 and the second flow channel 13.

The heater 2 regulates a temperature of the coolant water in the second flow channel 13, and specifically heats the coolant water in the second flow channel 13. Examples of the heater 2 include a heater jacket and a ribbon heater which are wound around a piping included in the second flow channel 13. The heater 2 regulates the temperature of the coolant water to a second temperature T2 as a setting temperature. The second temperature T2 of the present embodiment is 40° C.

The first and second flow channels 12 and 13 are joined to the flow channel 14. Therefore, the coolant water in the first flow channel 12 and the coolant water in the second flow channel 13 are flowed into the flow channel 14 and mixed. The coolant water at the first temperature T1 flows into the flow channel 14 from the first flow channel 12. The coolant water at the second temperature T2 flows into the flow channel 14 from the second flow channel 13.

The valve box 3 is arranged at a junction of the first flow channel 12 and the second flow channel 13. The valve box 3 can regulate a flow rate of a coolant water in the first flow channel 12 and a flow rate of a coolant water in the second flow channel 13. Specifically, the valve box 3 of the present embodiment can regulate a ratio between the flow rate of the former coolant water and the flow rate of the latter coolant water.

The valve box 3 can regulate a temperature of the coolant water in the flow channel 14 to a third temperature T3 by regulating these flow rates. The coolant water in the flow channel 14 is an example of joined fluids in the disclosure. The third temperature T3 is a temperature between the first temperature T1 and the second temperature T2 (T1≤T3≤T2). For example, the valve box 3 can regulate a temperature of the coolant water in the flow channel 14 to 25° C. by regulating a ratio between the flow rate of the former coolant water and the flow rate of the latter coolant water to 3:1. The coolant water regulated to the third temperature T3 is supplied in the process chamber 4 via the flow channel 14.

The process chamber 4 can house the wafer 31 to be processed. The wafer 31 is mounted on the ESC 4a in the process chamber 4. The process chamber 4 includes an upper electrode 21 and a lower electrode 22 for applying a bias voltage to the wafer 31, and an insulator 23 covering the lower electrode 22. The lower electrode 22 and the insulator 23 are included in the ESC 4a.

The process chamber 4 can regulate a temperature of the wafer 31 on the ESC 4a by the coolant water supplied from the flow channel 14. The ESC 4a is connected to the flow channels 14 and 15. The coolant water supplied from the flow channel passes through a flow channel in the ESC 4a and is discharged to the flow channel 15. The coolant water can cool the wafer 31 while passing in the ESC 4a.

The coolant water discharged from the process chamber 4 is supplied to the chiller 1 via the flow channel 15 and introduced in the chiller 1 from an inlet of the chiller 1. The chiller 1 regulates a temperature of the coolant water to the first temperature T1 again to discharge it to the flow channel 11. In this manner, the coolant water circulates in the semiconductor manufacturing apparatus.

The temperature detector 5 detects the temperature of the ESC 4a as indicated by an arrow S1. The temperature detector 5 is, for example, a thermometer or a temperature sensor. The temperature of the ESC 4a is an example of a temperature of a portion in the housing. The temperature of the ESC 4a detected by the temperature detector 5 is sent to the controller 6 as indicated by an arrow S2.

The controller 6 controls various operations of the semiconductor manufacturing apparatus. For example, the controller 6 controls a cooling process by the chiller 1, a heating process by the heater 2, opening/closing of the valve box 3, a plasma processing by the process chamber 4 and the like.

The controller 6 controls the operation of the valve box 3 based on the temperature of the ESC 4a detected by the temperature detector 5, as indicated by an arrow S3. Specifically, the controller 6 regulates the flow rate of the coolant water in the first flow channel 12 and the flow rate of the coolant water in the second flow channel 13 based on the temperature of the ESC 4a. For example, when the temperature of the ESC 4a is too high, the flow rate of the coolant water in the first flow channel 12 is increased, so that the third temperature T3 is lowered. On the other hand, when the temperature of the ESC 4a is too low, the flow rate of the coolant water in the second flow channel 13 is increased, so that the third temperature T3 is increased. In this manner, the controller 6 can regulate the temperature of the ESC 4a to a desired temperature. The controller 6 of the present embodiment can regulate the temperature of the wafer 31 mounted on the ESC 4a to a desired temperature by regulating the temperature of the ESC 4a.

As described above, the semiconductor manufacturing apparatus of the present embodiment includes the chiller 1 and the heater 2 as temperature regulators for regulating the temperature of coolant water. The chiller 1 regulates the coolant water temperature to the first temperature T1. The heater 2 regulates the coolant water temperature to the second temperature T2. Therefore, according to the present embodiment, the temperature of the coolant water to be supplied to the process chamber 4 can be regulated to the third temperature T3 that is between the first temperature T1 and the second temperature T2.

A process for controlling the temperature of the coolant water to T3 that is between T1 and T2 is generally performed by two or more chillers. However, if the number of chillers increases, a wide installation region for installing these chillers becomes necessary.

Meanwhile, in the present embodiment, the coolant water supplied from the first temperature regulator flows separately into the first and second flow channels 12 and 13. The temperature of the coolant water in the second flow channel 13 is then regulated by the second temperature regulator, and the coolant water in the first flow channel 12 and the coolant water in the first flow channel 13 are mixed in the flow channel 14. Therefore, the present embodiment makes it possible to regulate the temperature of the coolant water to T3 that is between T1 and T2, by using the chiller 1 as the first temperature regulator and using the heater 2 as the second temperature regulator. In other words, the present embodiment makes it possible to perform the process for regulating the temperature of the coolant water to T3 that is between T1 and T2 by one chiller 1.

In general, a structure of the heater 2 is simpler than a structure of the chiller 1, and an installation region of the heater 2 can be smaller than an installation region of the chiller 1. For example, if the heater 2 is the heater jacket or the ribbon heater, the heater 2 is installed such that it is wound around the piping included in the second flow channel 13. In this case, the heater 2 can be installed at a very small region. Therefore, the present embodiment makes it possible to reduce the installation region of the temperature regulators (the chiller 1 and the heater 2) for regulating the temperature of the coolant water.

Furthermore, the semiconductor manufacturing apparatus of the present embodiment regulates the temperature of the coolant water to be supplied to the process chamber 4 by regulating the flow rate of the coolant water in the first flow channel 12 and the flow rate of the coolant water in the second flow channel 13. In general, control of the temperature of the coolant water by a flow rate regulation can be performed at a high speed in comparison with control of the temperature of the coolant water by the chiller 1 and the heater 2. Therefore, according to the present embodiment, the temperature of the coolant water in the flow channel 14 can be quickly regulated by regulating the flow rate of the coolant water.

As described above, the present embodiment makes it possible to reduce the installation region of the temperature regulators for regulating the temperature of the coolant water temperature and to reduce an area for installing the semiconductor manufacturing apparatus.

The process chamber 4 of the semiconductor manufacturing apparatus of the present embodiment may be a chamber for performing a processing other than the plasma processing. Also, the heater 2 of the present embodiment may be an apparatus other than the heater jacket and the ribbon heater. Furthermore, a fluid other than water may be used as a refrigerant in the semiconductor manufacturing apparatus of the present embodiment.

Second Embodiment

Figure 2:
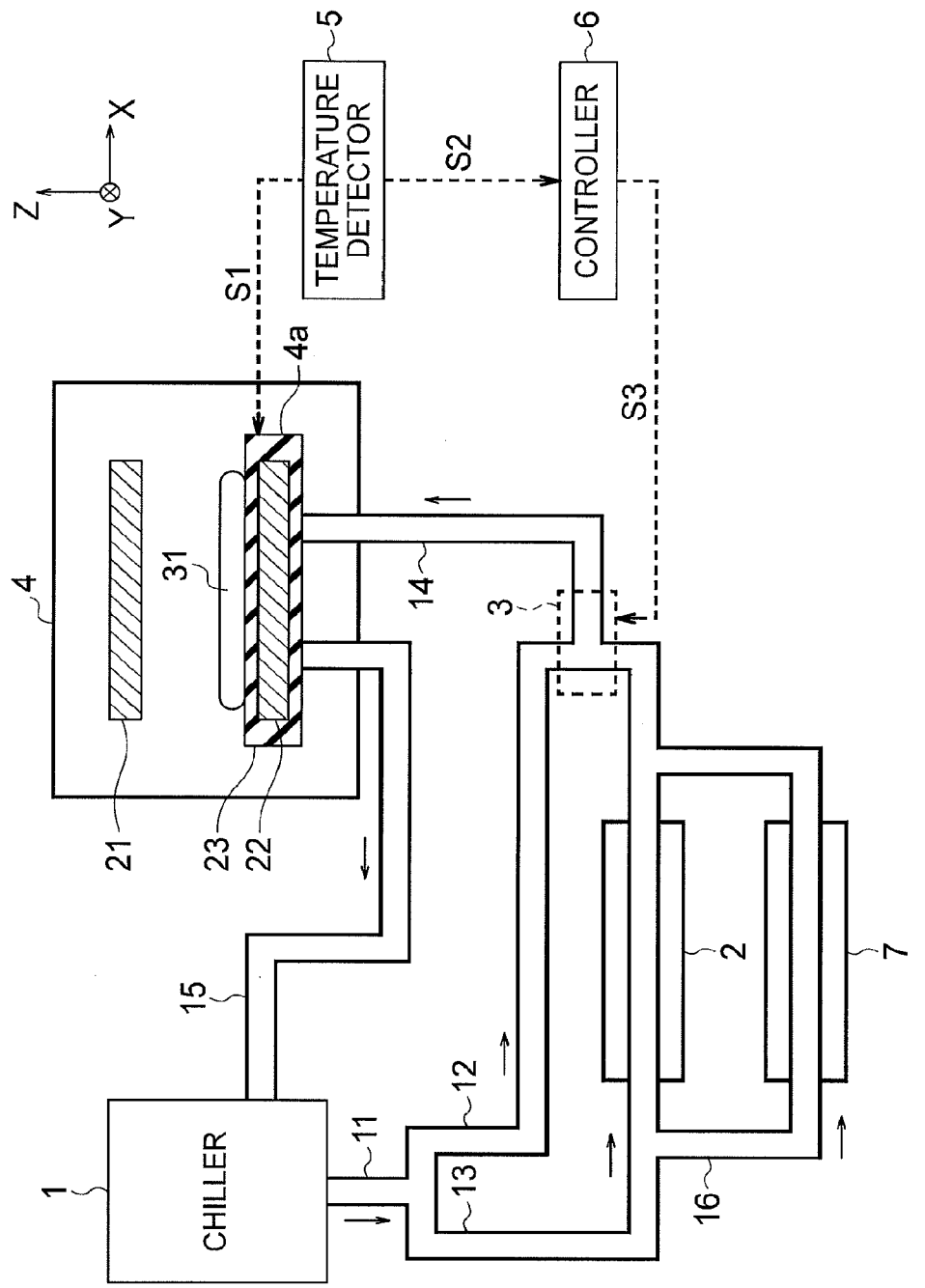
FIG. 2 is a schematic view illustrating a structure of a semiconductor manufacturing apparatus of a second embodiment.

FIG. 2 is a schematic view illustrating a structure of a semiconductor manufacturing apparatus of a second embodiment.

In addition to components illustrated in FIG. 1, the semiconductor manufacturing apparatus illustrated in FIG. 2 includes a heater 7 and a third flow channel 16. The heater 7 is an example of a third temperature regulator.

The flow channel 11 of the present embodiment is branched to the first, second and third flow channels 12, 13 and 16. Specifically, the flow channel 11 is branched to the first and second flow channels 12 and 13, and the third flow channel 16 is branched from the second flow channel 13. Therefore, the coolant water in the flow channel 11 flows separately to the first, second and third flow channels 12, 13 and 16.

The heater 7 regulates the temperature of the coolant water in the third flow channel 16, and specifically heats the coolant water in the third flow channel 16. Examples of the heater 7 include a heater jacket and a ribbon heater that are wound around a piping included in the third flow channel 16. The heater 7 regulates the temperature of the coolant water to a setting temperature. The setting temperature of the heater 7 may be or may not be same as the setting temperature of the heater 2 (the second temperature T2).

The third flow channel 16 is separated from the second flow channel 13 at an upstream point of the heater 2 and joined to the second flow channel 13 at a downstream point of the heater 2. Therefore, the coolant water heated in the third flow channel 16 is mixed with the coolant water heated in the second flow channel 13 and then flows into the valve box 3 and the flow channel 14.

As described above, the semiconductor manufacturing apparatus of the present embodiment includes the chiller 1 and the heaters 2 and 7 as temperature regulators for regulating the temperature of the coolant water. The present embodiment makes it possible, as similar to the first embodiment, to regulate the temperature of the coolant water by one chiller 1. Therefore, the present embodiment makes it possible to reduce the installation region of the temperature regulators (the chiller 1 and the heaters 2 and 7) for regulating the temperature of the coolant water.

Although the heaters 2 and 7 of the present embodiment are arranged in parallel, they may be arranged in series. Furthermore, the semiconductor manufacturing apparatus of the present embodiment may include three or more heaters arranged in parallel and/or series.

In the present embodiment, a valve box similar to the valve box 3 may be arranged at a junction between the second flow channel 13 and the third flow channel 16. In this case, an operation of this valve box may be controlled by a controller 6.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a housing configured to house a substrate;
a first temperature regulator configured to regulate a temperature of a fluid;
first, second and third flow channels configured to divide the fluid supplied from the first temperature regulator;
a second temperature regulator configured to regulate a temperature of the fluid in the second channel;
a third temperature regulator configured to regulate a temperature of the fluid in the third flow channel;
a fluid supply channel configured to join the fluid in the first flow channel and the fluid in the second flow channel and to supply the joined fluids to the housing; and
a flow rate regulator configured to regulate a flow rate of the fluid in the first flow channel and a flow rate of the fluid in the second flow channel;
wherein the fluid in the first flow channel, the fluid in the second flow channel, and the fluid in the third flow channel flow into the fluid supply channel.

2. The apparatus of claim 1, wherein
the first temperature regulator regulates the temperature of the fluid to a first temperature,
the second temperature regulator regulates the temperature of the fluid in the second flow channel to a second temperature, and
the flow rate regulator regulates a temperature of the joined fluids in the fluid supply channel to a third temperature that is between the first temperature and the second temperature.

3. The apparatus of claim 1, wherein the first temperature regulator is a chiller configured to cool the fluid.

4. The apparatus of claim 1, wherein the second temperature regulator is a heater configured to heat the fluid in the second flow channel.

5. The apparatus of claim 4, wherein the second temperature regulator is a heater jacket or a ribbon heater, the heater jacket or the ribbon heater being wound around the second flow channel.

6. The apparatus of claim 1, wherein the housing processes the substrate by using plasma.

7. The apparatus of claim 1, wherein the housing comprises upper and lower electrodes that apply a voltage to the substrate and an insulator covering the lower electrode, the substrate being mounted on the lower electrode through the insulator.

8. The apparatus of claim 1, comprising a temperature detector configured to detect a temperature of a portion in the housing,
wherein the flow rate regulator regulates a flow rate of the fluid in the first flow channel and a flow rate of the fluid in the second flow channel, based on the temperature of the portion in the housing detected by the temperature detector.

9. The apparatus of claim 1, further comprising a flow channel configured to supply the fluid discharged from the housing to the first temperature regulator.

10. A semiconductor manufacturing apparatus comprising:
a housing configured to house a substrate;
a first temperature regulator configured to regulate a temperature of a fluid;
a second temperature regulator configured to regulate a temperature of the fluid;
a third temperature regulator configured to regulate a temperature of the fluid;
a fluid supply channel configured to join a first fluid that has passed through only the first temperature regulator of the first and second temperature regulators and a second fluid that has passed through both of the first and second temperature regulators and to supply the joined first and second fluids to the housing; and a flow rate regulator configured to regulate a ratio between a flow rate of the first fluid and a flow rate of the second fluid;

wherein the first fluid, the second fluid, and a third fluid that has passed through the third temperature regulator flow into the fluid supply channel.

11. A semiconductor manufacturing method comprising:

housing a substrate in a housing;

regulating a temperature of a fluid by a first temperature regulator;

dividing the fluid supplied from the first temperature regulator to first, second and third flow channels;

regulating a temperature of the fluid in the second flow channel by a second temperature regulator;

regulating a temperature of the fluid in the third flow channel by a third temperature regulator;

joining the fluid in the first flow channel and the fluid in the second flow channel and supplying the joined fluids to the housing via a fluid supply channel; and regulating a ratio between a flow rate of the fluid in the first flow channel and a flow rate of the fluid in the second flow channel by a flow rate regulator;

wherein the fluid in the first flow channel, the fluid in the second flow channel, and the fluid in the third flow channel flow into the fluid supply channel.

12. The method of claim 11, further comprising regulating a temperature of a portion in the housing by the fluid from the fluid supply channel.

13. The method of claim 11, wherein the first temperature regulator regulates the temperature of the fluid to a first temperature, the second temperature regulator regulates the temperature of the fluid in the second flow channel to a second temperature, and the flow rate regulator regulates a temperature of the joined fluids in the fluid supply channel to a third temperature that is between the first temperature and the second temperature.

14. The method of claim 11, wherein the first temperature regulator is a chiller configured to cool the fluid.

15. The method of claim 11, wherein the second temperature regulator is a heater configured to heat the fluid in the second flow channel.

16. The method of claim 11, wherein the housing processes the substrate by using plasma.

17. The method of claim 11, wherein the housing comprises upper and lower electrodes that apply a voltage to the substrate and an insulator covering the lower electrode, the substrate being mounted on the lower electrode through the insulator.

18. The method of claim 11, comprising detecting a temperature of a portion in the housing by a temperature detector, wherein the flow rate regulator regulates a flow rate of the fluid in the first flow channel and a flow rate of the fluid in the second flow channel, based on the temperature of the portion in the housing detected by the temperature detector.

* * * * *